(12) United States Patent
Gazneli et al.

(10) Patent No.: US 10,075,201 B1
(45) Date of Patent: Sep. 11, 2018

(54) ADAPTIVE NONLINEAR SYSTEM CONTROL USING ROBUST AND LOW-COMPLEXITY COEFFICIENT ESTIMATION

(71) Applicant: Intel IP Corporation, Santa Clara, CA (US)

(72) Inventors: Avi Gazneli, Rehovot (IL); Michael Kerner, Tel Mond (IL); Itay Almog, Ganey Tikva (IL); Amit Knoll, Tel-Aviv-Yafo (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/648,205

(22) Filed: Jul. 12, 2017

(51) Int. Cl.
*H04B 1/04* (2006.01)
*H03F 3/24* (2006.01)
*H03F 1/32* (2006.01)

(52) U.S. Cl.
CPC ......... *H04B 1/0475* (2013.01); *H03F 1/3247* (2013.01); *H03F 3/245* (2013.01); *H03F 2200/294* (2013.01); *H03F 2200/451* (2013.01); *H04B 2001/0425* (2013.01)

(58) Field of Classification Search
CPC ......... H04B 1/0475; H04B 2001/0425; H04B 1/62; H04L 27/368
USPC .................................................. 375/295–297
See application file for complete search history.

(56) References Cited

U.S. PATENT DOCUMENTS

| | | | |
|---|---|---|---|
| 7,796,960 B1 * | 9/2010 | Rashev ............. | H04L 25/03063 455/114.3 |
| 9,245,072 B2 * | 1/2016 | Jia ...................... | G06F 17/5036 |
| 2005/0116775 A1 * | 6/2005 | McBeath ............. | H03F 1/3241 330/149 |
| 2008/0152037 A1 * | 6/2008 | Kim ...................... | H03F 1/3247 375/297 |
| 2010/0090762 A1 * | 4/2010 | van Zelm ............. | H03F 1/3247 330/84 |

(Continued)

OTHER PUBLICATIONS

"Cholesky decomposition", Wikipedia, Accessed on Mar. 20, 2018 https://en.wikipedia.org/wiki/Cholesky_decomposition, (Mar. 14, 2018), 13 pgs.

(Continued)

*Primary Examiner* — Emmanuel Bayard
(74) *Attorney, Agent, or Firm* — Schwegman Lundberg & Woessner, P.A.

(57) ABSTRACT

An adaptive controller for a nonlinear system includes a Volterra filter having a transfer function defined by P coefficients. The controller includes an alignment/compensation circuit, which aligns the input samples to the output samples of the nonlinear system. The controller generates a P×P matrix using at least one of input samples to, or output samples from the nonlinear system and normalizes each element of the P×P matrix using a respective normalization factor. The controller generates and solves a system of P linear equations from the P×P matrix and a P×1 matrix derived from input and output samples of the nonlinear system using Cholesky decomposition that may include Fast Inverse Square Root operations and forward backward elimination to generate P values. The controller multiplies each of the P values by an inverse of a respective one of the normalization factors to generate the P coefficients for the Volterra filter.

25 Claims, 6 Drawing Sheets

(56) References Cited

U.S. PATENT DOCUMENTS

| | | | | |
|---|---|---|---|---|
| 2010/0093290 A1* | 4/2010 | van Zelm | H03F 1/3247 | 455/126 |
| 2012/0119810 A1* | 5/2012 | Bai | H03F 1/3247 | 327/317 |
| 2012/0119811 A1* | 5/2012 | Bai | H03F 1/3247 | 327/317 |
| 2013/0336377 A1* | 12/2013 | Liu | H04L 27/01 | 375/232 |
| 2014/0292406 A1* | 10/2014 | Dechen | H03F 1/30 | 330/149 |
| 2016/0191020 A1* | 6/2016 | Velazquez | H03H 21/0067 | 341/118 |
| 2016/0329927 A1* | 11/2016 | Xiong | H03F 3/24 | |
| 2018/0013456 A1* | 1/2018 | Miyazaki | H04B 1/0475 | |
| 2018/0026586 A1* | 1/2018 | Carbone | H03F 1/3241 | |

OTHER PUBLICATIONS

"Fast inverse square root", Wikipedia, Accessed on Mar. 20, 2018 https://en.wikipedia.org/wiki/Fast_inverse_square_root, (Mar. 16, 2018), 10 pgs.

"Feature Scaling", Wikipedia, Accessed on Mar. 20, 2018 https://en.wikipedia.org/wiki/Feature_scaling, (Dec. 2, 2017), 3 pgs.

"Single-precision floating-point format", Wikepedia, Accessed on Mar. 20, 2018 https://en.wikipedia.org/wiki/Single-precision_floating-point_format, (Mar. 12, 2018), 7 pgs.

Ding, Lei, "Digital Predistortion of Power Digital Predistortion of Power Amplifiers", School of Electrical and Computer Engineering Georgia Institute of Technology, (Mar. 2004), 117 pgs.

Morgan, Dennis R, et al., "A Generalized Memory Polynomial Model for Digital Predistortion of RF Power Amplifiers", IEEE Transactions on Signal Processing, vol. 54, No. 10, (Oct. 2006), 3852-3860.

* cited by examiner

→ # ADAPTIVE NONLINEAR SYSTEM CONTROL USING ROBUST AND LOW-COMPLEXITY COEFFICIENT ESTIMATION

TECHNICAL FIELD

This Application relates to adaptive controllers for nonlinear systems and, in particular, to a digital predistortion (DPD) system for a power amplifier that generates predistortion coefficients based on signals amplified by the amplifier.

BACKGROUND

Many nonlinear systems that depend on both current and past data use Volterra series in their control apparatus. The coefficients that define the Volterra series are typically generated during a training phase and then applied to the control apparatus to control the processing of the actual data. The calculation of the coefficients presents computational challenges that make them difficult to implement for adaptive control of the nonlinear systems that calculate coefficients on the fly.

One such nonlinear system is a power amplifier used in communication equipments. These power amplifiers may generate distortion in adjacent frequency bands due to nonlinearities in the amplifier transfer functions. When the amplified signal has a relatively low bandwidth, the distortion caused by these nonlinearities can be corrected using a non-linear model that does not take into account any memory effects of the amplifier. As bandwidth increases, however, these memory effects become more significant. One way to reduce distortion is to change the operating point of the amplifier so that it is within a linear region of the amplifier transfer function. This technique, however, undesirably reduces both the power output and/or the efficiency of the amplifier. Digital predistortion systems for amplifiers processing wideband signals used in present and future communication systems employ predistortion models based on Volterra series that take into account the memory effects of the power amplifiers.

DESCRIPTION

Figure 1:
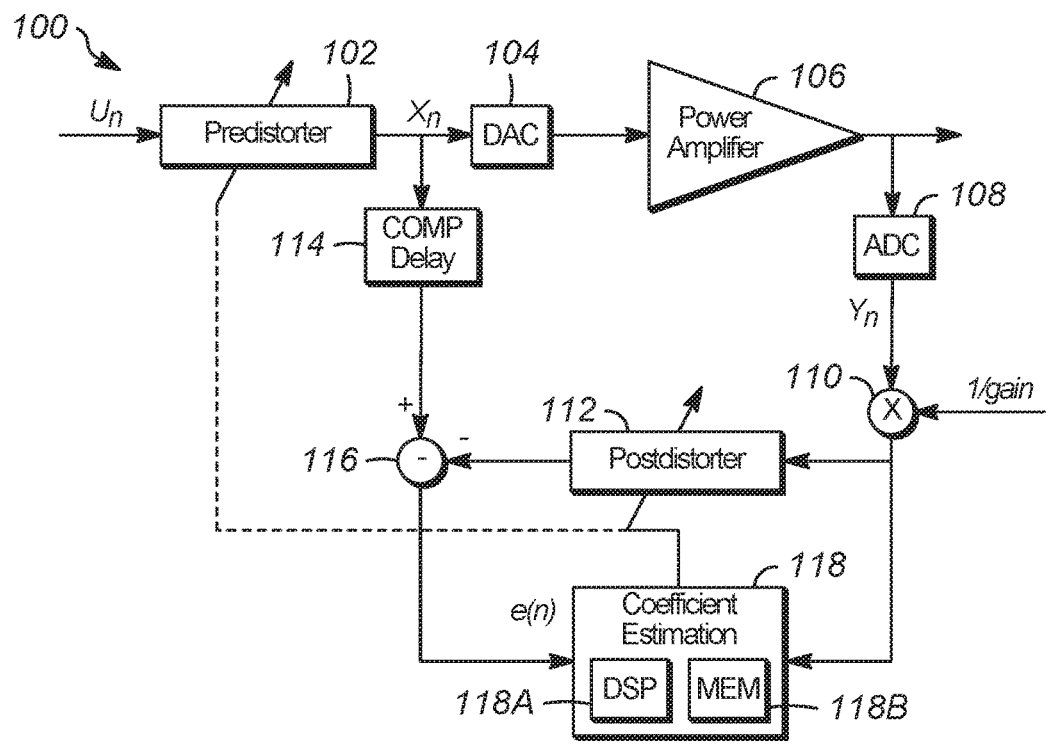
FIG. 1 is a block diagram of an exemplary DPD system according to the present disclosure.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various aspects of the disclosure. However, it will be apparent to those skilled in the art having the benefit of the present disclosure that the various aspects of the various aspects of the disclosure may be practiced in other examples that depart from these specific details. In certain instances, descriptions of well-known devices, circuits, and methods are omitted so as not to obscure the description of the various aspects of the disclosure with unnecessary detail.

Some DPD systems generate DPD coefficients based only on the instantaneous values of the inputs to and outputs from the power amplifier. These systems, which are referred to as being memoryless, may not adequately compensate for power amplifier nonlinearities. This is because many power amplifiers exhibit nonlinearities related to past as well as present input and output values. These nonlinearities may be the result of transport delay, thermal time constants, components of the biasing circuitry and the structure of and processing used to fabricate the power amplifiers. The memory effects may increase with increases in the bandwidth of the signals being processed.

Memory models for DPD employ a "memory polynomial" filter, which is a type of Volterra filter. The memory polynomial filter takes into account both present and past samples. This polynomial describes the digital predistortion to be applied to the input signals of the power amplifier in order to obtain output signals corresponding to a linear response to the input signal before the application of the predistortion. In order to handle wide bandwidth systems, the memory polynomial may have a relatively large number of coefficients (e.g. ~30 coefficients). One method for determining the values of the coefficients is to generate a system of linear equations based on input and output data for the power amplifier. This system of equations may be solved using Cholesky decomposition followed by forward and backward elimination. It may also be solved using other techniques, such as a QR solver or by matrix inversion.

Equation (1) is an example of memory polynomial model, in matrix form, that may be used in a DPD system. This polynomial has 25 coefficients.

$$U_{n,q_0} = [u_n \ u_n \cdot |u_n| \ u_n \cdot |u_n|^2 \ u_n \cdot |u_n|^3 \ u_n \cdot |u_n|^4] \quad (1)$$
$$U_{n,q_1} = [u_{n-1} \ u_{n-1} \cdot |u_{n-1}| \ u_{n-1} \cdot |u_{n-1}|^2 \ u_{n-1} \cdot |u_{n-1}|^3 \ u_{n-1} \cdot |u_{n-1}|^4]$$
$$U_{n,q_2} = [u_{n-2} \ u_{n-2} \cdot |u_{n-2}| \ u_{n-2} \cdot |u_{n-2}|^2 \ u_{n-2} \cdot |u_{n-2}|^3 \ u_{n-2} \cdot |u_{n-2}|^4]$$
$$U_{n,q_3} = [u_{n-3} \ u_{n-3} \cdot |u_{n-3}| \ u_{n-3} \cdot |u_{n-3}|^2 \ u_{n-3} \cdot |u_{n-3}|^3 \ u_{n-3} \cdot |u_{n-3}|^4]$$
$$U_{n,q_4} = [u_{n-4} \ u_{n-4} \cdot |u_{n-4}| \ u_{n-4} \cdot |u_{n-4}|^2 \ u_{n-4} \cdot |u_{n-4}|^3 \ u_{n-4} \cdot |u_{n-4}|^4]$$
$$U_n = [U_{n,q_0} \ U_{n,q_1} \ U_{n,q_2} \ U_{n,q_3} \ U_{n,q_4}]$$

where $$U = \begin{bmatrix} U_{n=1} \\ \vdots \\ U_{n=M} \end{bmatrix} \quad (2)$$

$M$ – Number of observations.

$x = U \cdot d$ $U \in C^{M \times 25}$

-continued $$d \in C^{25 \times 1}$$

$$\underline{x} \in C^{M \times 1}$$

In equations (1) and (2), U is a matrix representing the memory polynomial model based on a Volterra series, x is a vector of complex output samples of the predistorter, and d is a vector of coefficients for the predistorter. Equation (2) defines a set of linear equations that are used to estimate d.

Using least squares approach converts equation (2) to equation (3).

$$U^H \cdot x = U^H \cdot U \cdot d \quad (3)$$

The memory polynomial shown above has 25 complex coefficients that may be estimated based on the input and output signals of the power amplifier.

FIG. 1 is a block diagram of an example DPD system according to the present disclosure that shows one approach for estimating the predistortion parameters that uses a post-distortion or indirect learning model. In FIG. 1, $u_n$ are the input samples to the predistortion block 102, $x_n$ are the output samples of predistortion block and $y_n$ are digitized samples of the output of the power amplifier 104. The vector d is the predistortion coefficient vector that is calculated during the learning phase.

As shown in FIG. 1 the input samples $u_n$, are applied to a predistorter 102, the predistorter 102 modifies input samples according to a predistortion function, for example the function described by equation (2). The output samples, $x_n$, of the predistorter 102 are applied to a digital to analog converter (DAC) 104 to generate an analog input signal for the power amplifier 106. As described below with reference to FIG. 6, the output signal of the power amplifier 106 may be filtered and provided to an antenna for transmission to other devices in the wireless network. An example network is described below with reference to FIGS. 5-8. The output signal of the amplifier is digitized by an analog to digital converter (ADC) to generate the samples $y_n$ that are applied to a multiplier 110. The samples are multiplied by the inverse of the gain of the power amplifier 106. When the predistorter 102 has the proper parameter values, the output samples of the divider 110 should be the same as the input samples $u_n$. This signal is applied to a postdistorter 112 which may be identical to the predistorter 102. In the equation describing the example postdistorter, U and u are replaced by Y and y, as shown in equations (4), (5) and (6) corresponding to equations (1), (2) and (3), described above.

$$Y_{n,q_0} = [y_n \; y_n \cdot |y_n| \; y_n \cdot |y_n|^2 \; y_n \cdot |y_n|^3 \; y_n \cdot |y_n|^4] \quad (4)$$
$$Y_{n,q_1} = [y_{n-1} \; y_{n-1} \cdot |y_{n-1}| \; y_{n-1} \cdot |y_{n-1}|^2 \; y_{n-1} \cdot |y_{n-1}|^3 \; y_{n-1} \cdot |y_{n-1}|^4]$$
$$Y_{n,q_2} = [y_{n-2} \; y_{n-2} \cdot |y_{n-2}| \; y_{n-2} \cdot |y_{n-2}|^2 \; y_{n-2} \cdot |y_{n-2}|^3 \; y_{n-2} \cdot |y_{n-2}|^4]$$
$$Y_{n,q_3} = [y_{n-3} \; y_{n-3} \cdot |y_{n-3}| \; y_{n-3} \cdot |y_{n-3}|^2 \; y_{n-3} \cdot |y_{n-3}|^3 \; y_{n-3} \cdot |y_{n-3}|^4]$$
$$Y_{n,q_4} = [y_{n-4} \; y_{n-4} \cdot |y_{n-4}| \; y_{n-4} \cdot |y_{n-4}|^2 \; y_{n-4} \cdot |y_{n-4}|^3 \; y_{n-4} \cdot |y_{n-4}|^4]$$
$$Y_n = [Y_{n,q_0} \; Y_{n,q_1} \; Y_{n,q_2} \; Y_{n,q_3} \; Y_{n,q_4}]$$

$$Y = \begin{bmatrix} Y_{n=1} \\ \vdots \\ Y_{n=M} \end{bmatrix}$$

where

M – Number of observations.

$$x = Y \cdot d$$

$$Y \in C^{M \times 25}$$

$$\underline{d} \in C^{25 \times 1}$$

$$\underline{x} \in C^{M \times 1}$$

$$\underline{x} = Y \cdot \underline{d} \quad (5)$$

$$Y^H \cdot \underline{x} = Y^H \cdot Y \cdot \underline{d} \quad (6)$$

where d is the predistortion/postdistortion coefficient vector (e.g. a column vector having dimensions P×1), Y is the matrix constructed from power amplifier measurements having dimensions M×P; $Y^H$ is the conjugate transpose of Y; x is the input data to the system, i.e. the data to be transmitted (e.g. a column vector having dimensions M×1); P is the total number of predistortion coefficients; and M is the number of samples in the input and output signal vectors. M may be a relatively large number (e.g. on the order of 1000-16000).

The output signal of the divider 110 is also applied to a coefficient estimation block 118 which may include a processor, such as a digital signal processor (DSP) 118A capable of handling single-precision floating-point operations and a memory 118B. The other input to the parameter estimation block 118 is an error signal $e_n$ that is generated by a subtracter 116. The subtracter 116 receives the signal $x_n$ provided by the predistorter 102 delayed by compensating delay element 114 so that the samples $x_n$ provided by the delay element 114 match, in time, the $y_n$ samples provided by the postdistorter 112. Thus, the error samples $e_n$ provided by the subtracter 116 represent nonlinearities in the power amplifier 106 that are not compensated by the predistorter 102.

The coefficient estimation block 118 processes the error signal and the signal $y_n$ to adjust the estimated parameters for the predistorter 102 and postdistorter 112, as indicated by the vector d, to drive the error signal $e_n$ toward zero. The coefficient estimation block 118 may use any of a number of optimization algorithms, for example, a least-squares algorithm.

Figure 2:
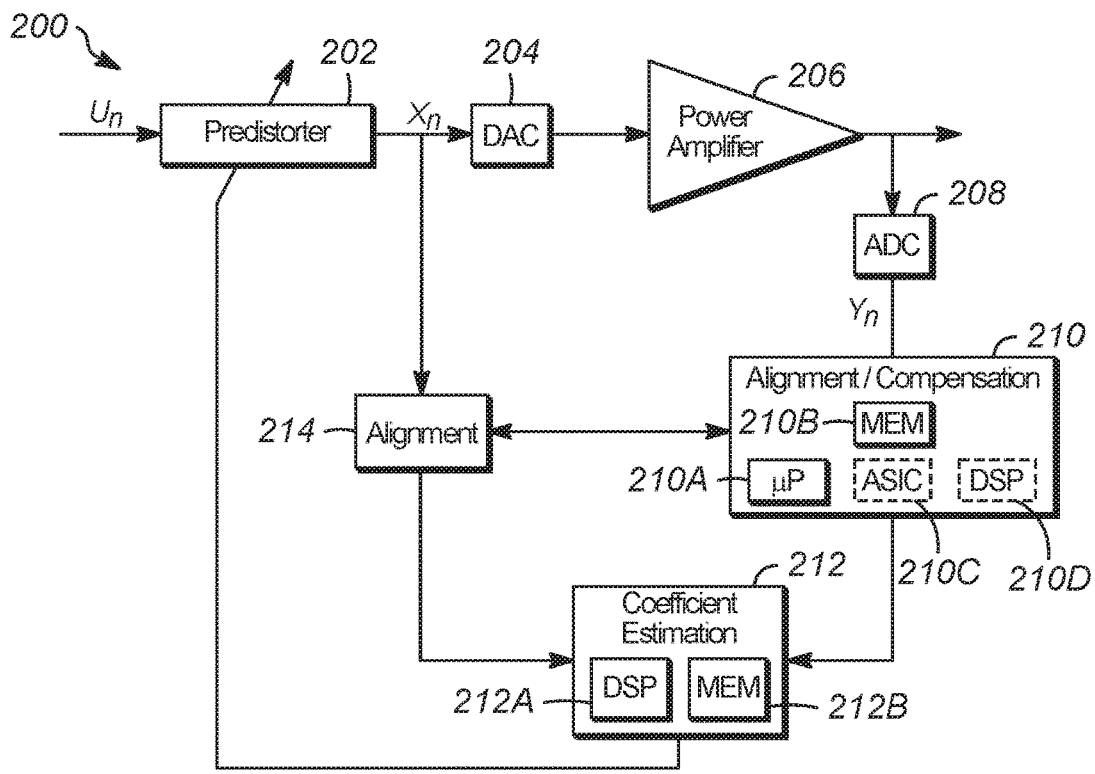
FIG. 2 is a block diagram of another example DPD system according to the present disclosure.

FIG. 2 is a block diagram of another example DPD system according to the present disclosure. FIG. 2 shows an example DPD system that determines coefficients for a predistortion filter, such as the filter described by equation (5) using a system of linear equations derived from the output samples $y_n$ of the power amplifier 106 and the output samples $x_n$, of the predistorter 202. As with the system shown in FIG. 1, the input samples $u_n$, are processed by the predistorter 202 to generate the predistorted signal $x_n$, which is applied to DAC 204. The analog signal provided by DAC 204 is amplified by power amplifier 206 to produce the signal that may be filtered and applied to the antenna(s) (not shown in FIG. 2) for transmission to other devices in the network. The output signal of the power amplifier 206 is also applied to ADC 208 to generate the digitized samples $y_n$ that are applied to alignment/compensation circuitry 210. The output signal of the circuitry 210 is applied to one input terminal of the coefficient estimation block 212, which may include a memory 212B and a processor 212A, such as a DSP capable of handling single-precision floating-point calculations. The other input to the coefficient estimation block is the output samples $x_n$ provided by the predistorter 202 that are aligned with the $y_n$ samples by an alignment block 214. As described below, the coefficient estimation block 212 uses samples $y_n$ to generate a system of 28 linear equations, one for each coefficient value, and solves the system of linear equations to generate the coefficient vector d for the predistorter 202. In the system shown in FIG. 2, the aligned and compensated signal $y_n$ provided by block 210 should be the same as the input signal $u_n$. Thus, the coefficients generated by the coefficient estimation block 212 are both the postdistortion coefficients and the predistortion coefficients. The operation of the alignment block 214 and the alignment/compensation block 210 are described below with reference to FIG. 3. The alignment/compensation block 210 may include a microprocessor (μP) 210A and a memory 210B. Alternatively or in addition, block 210 may include an application specific integrated circuit (ASIC) 210C, a programmable logic array (not shown) and/or a digital signal processor (DSP) 210D.

During the learning phase the predistortion coefficients are estimated by a postdistortion technique. The predistortion coefficients d are determined by solving Equation (6). Equation (6) can be rewritten as equation (7) using the following notation:

$A=(Y^H \cdot Y)$ where $A$ is a Hermitian positive definite matrix $(P \times P)$ $b=(Y^H \cdot x)$ where $b$ is a column vector $(P \times 1)$ $$A \cdot d = b \quad (7)$$

Rather than generating the matrices Y and $Y^H$ in their entirety, the example system processes an M×1 vector of Y samples (i.e. one row at a time to generate a respective element of the matrix A). Equation (7) can be solved for d using several methods. One method may be to use a QR-based solver. Another method may be to invert the A matrix (i.e. $A^{-1}$) and multiply b by $A^{-1}$ to generate d. The examples described below use Cholesky decomposition to generate a system of linear equations followed by forward and backward elimination to solve the system of linear equations. This method is used due to its efficiency and numerical stability and also has the advantage of using less memory than the other methods, as these other methods may use a stored Y matrix or store both the matrix A and its inverse.

There are two issues, however, related to the solution of equation (7) using Cholesky decomposition followed by forward and backward elimination. The first issue concerns the high condition number of A matrix which affects the accuracy and stability of the solution, d. Matrix A generally has a high condition number because there is a relatively large correlation among the columns of the matrix Y. There are two sources for this large correlation: First, the nonlinear polynomials, such as $y_n$, $y_n \cdot |y_n|$, $y_n \cdot |y_n|^2$ etc. are highly correlated. Second, the data samples $y_n$, with consecutive time indices tend to be correlated.

The correlation due to the first source can be reduced by using orthogonal polynomials. The correlation from the second source, theoretically, can be alleviated by using a special training signal having samples collected at independent time indices. The example aspects of the disclosure described below, however, are adaptive and estimate the DPD coefficients on the fly, using the operational packets. In this case and many other cases, the use of a dedicated training signal may not be applicable.

The aspects of the disclosure described below implement a lossless transformation that reduces the conditional number of matrix A and, thus, enables a practical implementation of Cholesky decomposition in hardware or in a digital signal processor (DSP).

The second issue is the complexity of Cholesky decomposition and forward and backward elimination. The Cholesky solver uses approximately $\frac{1}{3}P^3$ floating point multiply and/or add operations, where P is the number of unknown coefficients that are to be estimated by solving equation (7).

Usually division and square root operations are ignored, since they occur less frequently than multiply and/or add. This assumption is not correct in "low" dimensional systems (e.g. when the number of coefficients is less than 100). In the examples described below there are approximately 30 coefficients. Because of the overhead for each division and square root operation the incidence of these operations has a significant impact on the overall complexity of the matrix inversion operation and thus, the calculation of the coefficients.

The examples described below determine the DPD coefficients using Cholesky decomposition followed by forward and backward elimination. These examples reduce the complexity of these calculations by avoiding division and square root operations.

A first issue addressed by the example systems is reducing the high condition number of matrix A. As described above, the interfering distortion generated by non-linearities in the power amplifier response characteristic increases with an increase in the bandwidth and power output of the power amplifier. Thus, the number of coefficients used by the DPD model that pre-distorts the input signal to compensate for the non-linearities also increases with the increasing bandwidth and power of transmitted signals. The large number of coefficients affects the condition number of matrix A in equation (7). For example, a 256 quadrature amplitude modulation (QAM256) system having a bandwidth of 160 MHz and using an integrated CMOS power amplifier may use a DPD model having approximately 30 coefficients. As modulation techniques become more complex, for example QAM1024 that is used in IEEE 802.1 lax, the number of coefficients used in the DPD model will be further increased.

For a DPD model having ~30 coefficients the condition number of matrix A translates to a dynamic range of 170 dB. This relatively high condition number is due to a high correlation among the columns of the Y matrix. The high condition number results in an increase in the precision of the values of the elements of the A matrix. Assuming 6 dB per bit, a dynamic range of 170 dB results in a matrix A in which each element has a precision of approximately 29 significant bits (170/6). This level of precision is beyond the capability of many single-precision floating-point digital signal processors (DSPs) that may be used in consumer communication equipment such as mobile telephones, which have a 23 significant bits, an 8 bit exponent and one sign bit.

The examples below describe a lossless transformation that reduces a conditional number of matrix A from approximately 170 dB to approximately 50 dB, enabling a practical implementation of a solver using Cholesky decomposition in dedicated hardware or in a DSP capable of handling single-precision floating-point operations. Briefly, this transformation normalizes the elements in every element of matrix A.

A second issue concerns the complexity of the coefficient computation using Cholesky decomposition and forward and backward elimination. A straightforward implementation of Cholesky decomposition and forward and backward elimination uses division and square root operations. A typical division algorithm may use many processor cycles. For example using an Arc750 processor, a division operation may take 136 cycles. The examples below describe a low complexity Cholesky decomposition and forward and backward elimination that reduces the operational overhead by approximately 30 percent.

The examples described below decompose matrix A using modified Cholesky method in which, for each of the diagonal elements of the matrix A, (i.e. i==j), the modified method calculates and stores the value $1/\sqrt{a_{ii}}$ using a Fast Inverse Square Root operation. Example source code for the Fast Inverse Square Root operation is shown below in Table 1.

The Fast Inverse Square Root operation is a well-known operation that is used to generate angles of incidence and reflection in computer graphic applications. Briefly, the Fast Inverse Square Root operation receives a 32-bit floating-point number which is halved and stored. The 32-bit floating-point number is treated as a 32-bit integer and is logically shifted to the right by one bit position. The result is subtracted from a predetermined value: 0x5F3759DF. The result is a floating-point value which is a first approximation of the inverse square root of the input value. This value is refined by applying one or two iterations of the Newton Raphson method to yield a more precise approximation.

For matrix elements having i<j, the algorithm calculates the standard Cholesky term. The result is a matrix A that can be represented as $LTL^H$ where $L^H$ is the complex conjugate of a lower triangular matrix L and T is a diagonal matrix. To solve the system of equations, the algorithm runs forward backward elimination, which is free of any division operations. The example solver derives the reciprocal square root terms using fast inverse square root algorithm. The reciprocal square root terms are used in Cholesky decomposition for factorization stem and further in forward backward elimination. Thus the example solver uses only multiplication and addition operations.

The example algorithm has advantages over other algorithms. One alternative solution may be to simplify the DPD model for example, by using an orthogonal polynomial as described in a thesis by L. Ding entitled "Digital Predistortion of Power Amplifiers for Wireless Applications" Georgia Inst. of Tech. 2004. This solution, however, may increase the power amplifier distortion, resulting in a less efficient implementation. Another implementation may be to use a higher-precision DSP that would support a dynamic range of 170 dB. Such a DSP, however, would occupy more space in the integrated circuit and, thus, increase the cost of the DPD device.

By contrast, the example aspects of the disclosure modify the Cholesky model by feature scaling to reduce conditional number from ~170 dB to ~50 dB. This modification enables the estimation/learning phase of the Cholesky model to be implemented using a readily-available DSP.

Equation (7) has 25 complex coefficients corresponding to the number of elements in each of the sub-vectors $Y_{n,q_0}$, $Y_{n,q_1}$, $Y_{n,q_2}$, $Y_{n,q_3}$, $Y_{n,c_2}$, and $Y_{n,c_3}$ in equation (4).

The example method introduces scaling factors: $factor_{q_0}$, $factor_{q_1}$, $factor_{q_2}$, $factor_{q_3}$, $factor_{c_2}$, and $factor_{c_3}$. The number of the scaling factors is equal to the number of columns of the matrix Y, which is equal to the number of coefficients. The scaling factor values depend only on the signal characteristics. In one example, each scaling factor value is equal to the root-mean-square of the relevant term. Thus, the scaling factors can be calculated on the fly using less than all of the input samples. Alternatively, the scaling factors may be predefined values that approximate an average amplitude of the elements in a column.

The normalization of the matrix A results in all elements of the matrix being in the same scale, thus reducing the gap between maximal and minimal Eigenvalues. The relation between the original coefficients (used in the predistortion phase) and the estimated coefficients described by equation (9).

$$d_i = d_i/factor_i \qquad (9)$$

This transformation reduces conditional number of matrix A from ~170 dB to ~50 dB. Furthermore, the use of a reduced complexity Cholesky decomposition with forward-backward elimination by decomposing matrix A to a $LTL^H$ matrix where T is a diagonal matrix, the one-time calculation of the inverses of the diagonal elements, and the use of a Fast Inverse Square Root to calculate the inverses of the diagonal terms results in DPD coefficients that allow for efficient amplification of wide-bandwidth signals with greatly reduced distortion. By precalculating the inverse square roots of the diagonal elements, the factoring of the A matrix, and thus, the solving of the system of linear equations the using Cholesky decomposition followed by forward and backward elimination may be implemented using only multiply and add operations.

For a comparison of the overhead between the example method and a conventional method, the division operator for an Arc750 processor takes 136 cycles but takes only 25 cycles using the Fast Inverse Square Root operation with two iterations of the Newton Raphson method. The resulting values have an error of less than −100 dB:

An example Fast Inverse Square Root operation is shown in Table 1:

TABLE 1

```
INLINE FLOAT Inline_fastInvSgrt2(FLOAT x)
{
    FLOAT xhalf = 0.5f * x;
    int i = *(int*)&x; // store floating-point bits in integer
    i = 0x5f3759df - (i >> 1); // initial guess for the Newton
    Raphson method
    x = *(float*)&i; // convert new bits into float
    x = x*(1.5f - xhalf*(x*x)); // 1st round of the Newton
    Raphson method x = x*(1.5f - xhalf*(x*x)); // 2nd round of
    the Newton Raphson method
    return x;
}
```

Figure 3:
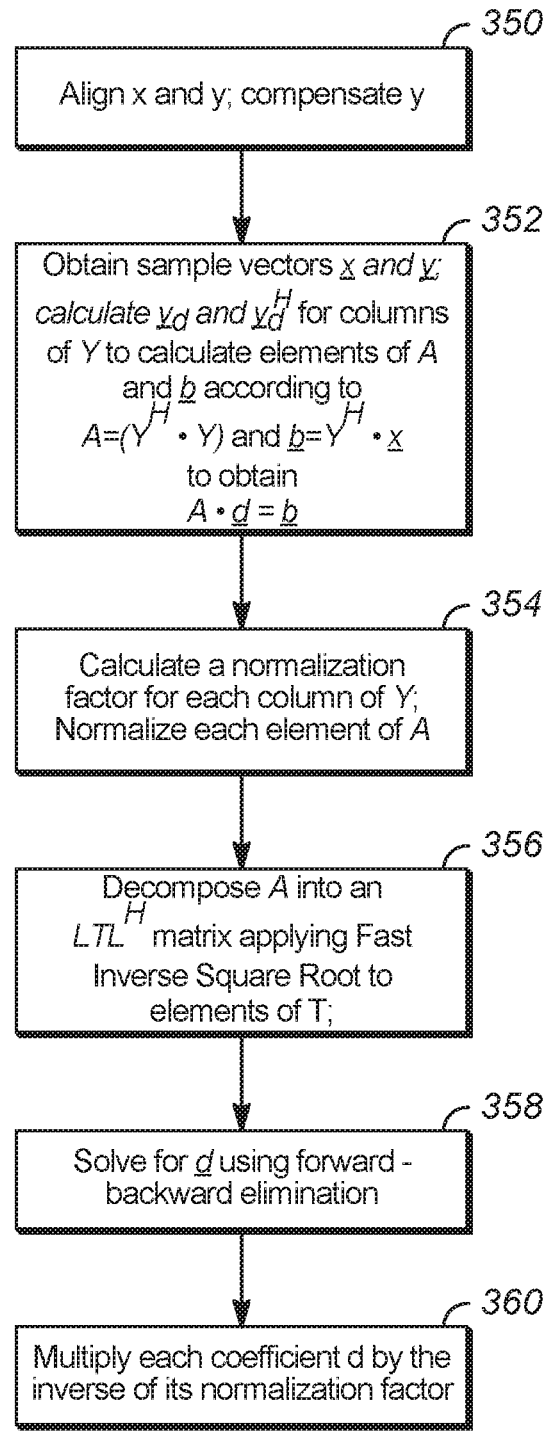
FIG. 3 is a flow-chart diagram that is useful for describing the operation of an example DPD system.

FIG. 3 is a flow chart diagram that is useful for describing the operation of an example DPD system and, in particular, an example implementation of blocks 210 and 212 of FIG. 2. As described above, the output samples, $y_n$, provided by the ADC 208 alignment/compensation block 210 which is shown in FIG. 3 as block 350. Block 350 performs several functions, including IQ imbalance correction, direct current (DC) removal, delay compensation, phase adjustment and gain compensation. The delay compensation aligns the $y_n$ samples with the $x_n$ samples provided by alignment block 214. The output samples provided by block 350 are the values $x_n$ and $y_n$ that are used by the system as described above with reference to equations (4)-(7).

At block 352, the system obtains sample vectors x and y, calculates a column vector, $y_d$ of the matrix Y, as described by equation (4) and calculates values corresponding to $y_d^H$. As shown in equation (4), the column vectors $y_d$ and $y_d^H$ are mathematical operations over the vector y. Next, block 352 generates elements of the matrix A and the vector b as described above with reference to equations (6) and (7). This process repeats for each column $y_d$ of the Y matrix and corresponding columns $y_d^H$ used to calculate a respective element of the matrix A, until all elements of the P×P matrix A have been calculated and the elements of the vector b have been calculated. Block 354 also calculates respective normalization factors $\sigma_i$ by calculating $$\sigma_i = \sqrt{\frac{M}{a_{ii}}}$$

using the Fast Inverse Square Root operation. Each of these normalization factors correspond to the root mean square (RMS) of the elements of a respective column of the Y matrix. The normalization factors are used to scale the elements of both the matrix A (by calculating $a_{ij}:=a_{ij}\cdot\sigma_i\cdot\sigma_j$) and the vector b (by calculating $b_i:=b_i\cdot\sigma_i$). Alternatively, the normalization factors may be generated by directly calculating the root mean square (RMS) for each column of the matrix Y. In yet another alternative, the normalization factors may be predetermined values. Block 356 uses Cholesky decomposition to decompose the scaled matrix A into an $LTL^H$ modified A matrix including applying the Fast Inverse Square Root operation to the elements of the diagonal matrix T to aid in the factorization of the modified A matrix by the Cholesky decomposition process.

Block 358 solves the system of linear equations for the vector d using forward-backward elimination. Each element, $d_i$, of the vector d is then multiplied by $1/\sigma_i$, the inverse of its corresponding scale factor to generate the coefficients for the predistorter 202, shown in FIG. 2. The functions shown in blocks 352-360 of FIG. 3 may be implemented using a DSP that is capable of handling single-precision floating-point operations. The functions shown in block 350 of FIG. 3 may be implemented using a microprocessor, ASIC, FPGA, PGA and/or DSP.

Although the examples described above have been in the context of a DPD filter for a communication power amplifier, it is contemplated that other aspects of the disclosure may have more general applications. Systems based on Volterra series, such as the filters described by equation (4), have applications in the adaptive control of nonlinear systems. For example Volterra series having a relatively large number of coefficients may be used for adaptive noise cancellation, acoustic echo cancellation, and the control of power distribution systems. Methods similar to those described above may be used to adaptively change the coefficients of these Volterra series.

Figure 4:
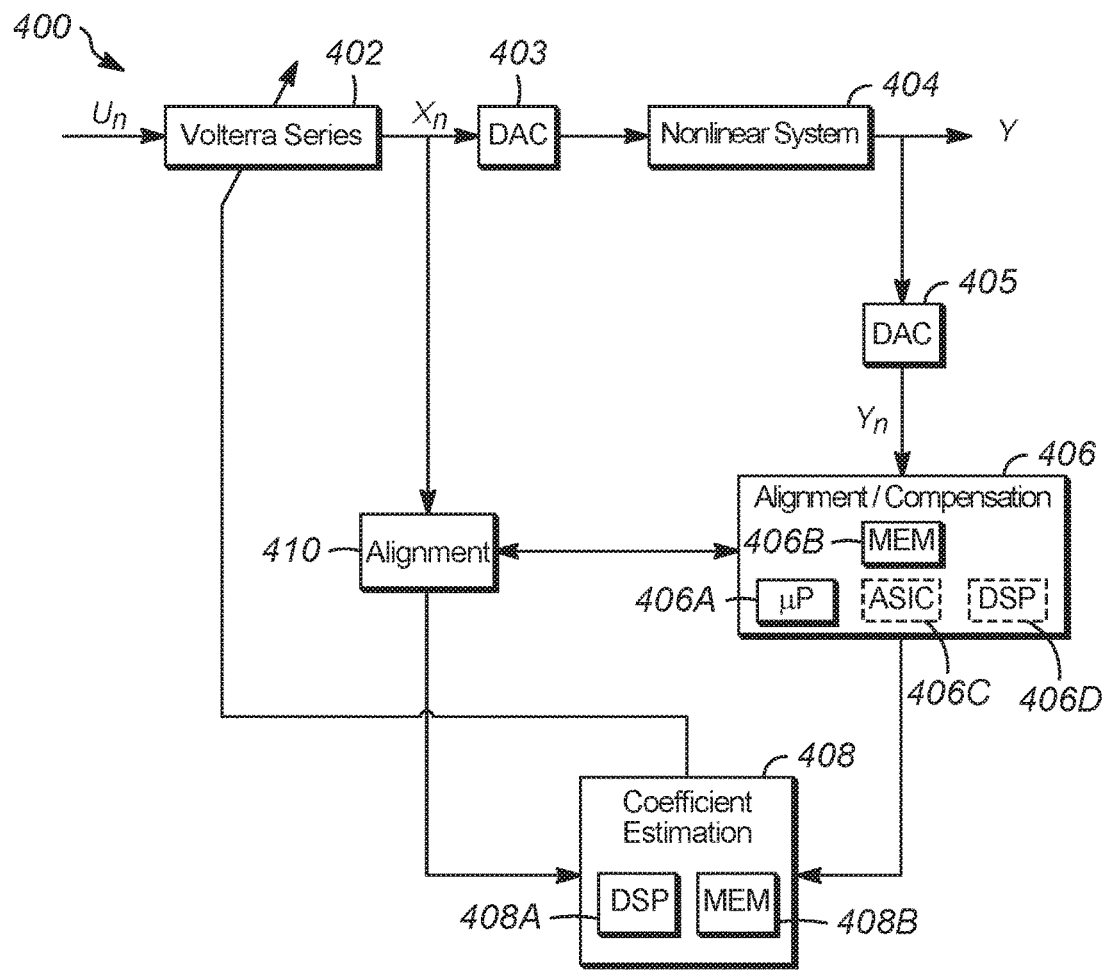
FIG. 4 is a block diagram of a generalized predistortion system for a nonlinear system.

FIG. 4 is a block diagram of a generalized predistortion system for a nonlinear system 400 employing circuitry 402 based on a Volterra series. Input samples $u_n$ are applied to the circuitry 402 which pre-distorts samples to produce samples $x_n$ for application to a nonlinear system 404. The predistorted samples $x_n$ which are then converted, by a DAC 403, to an analog signal that is applied to the nonlinear system 404. The output signal, Y, of the nonlinear system is applied to an ADC 405 to generate digitized samples $y_n$. The samples $x_n$ and $y_n$ are respectively applied to alignment block 410 and to alignment compensation block 406, which may be similar to the alignment block 214 and the alignment/compensation block 210 described above with reference to FIGS. 2 and 3. The aligned samples $x_n$ and $y_n$ are applied to a coefficient estimation system 408 which may be similar to the system described above with reference to FIG. 3 As described above, the alignment/compensation block 406 may include a microprocessor (μP) 406A and a memory 406B. Alternatively or in addition, it may include an application specific integrated circuit (ASIC) 406C, a programmable logic array (not shown) and/or a digital signal processor (DSP) 406D.

As with the DPD filters described above, the estimation of the coefficients for the Volterra series may be complicated by the correlation of columns in the matrix of values that constitute the system of linear equations used to solve for the coefficients. The techniques described above with reference to FIG. 3 may be used to economically solve for these coefficients without need to make the columns of the matrix Y orthogonal.

Figure 5:
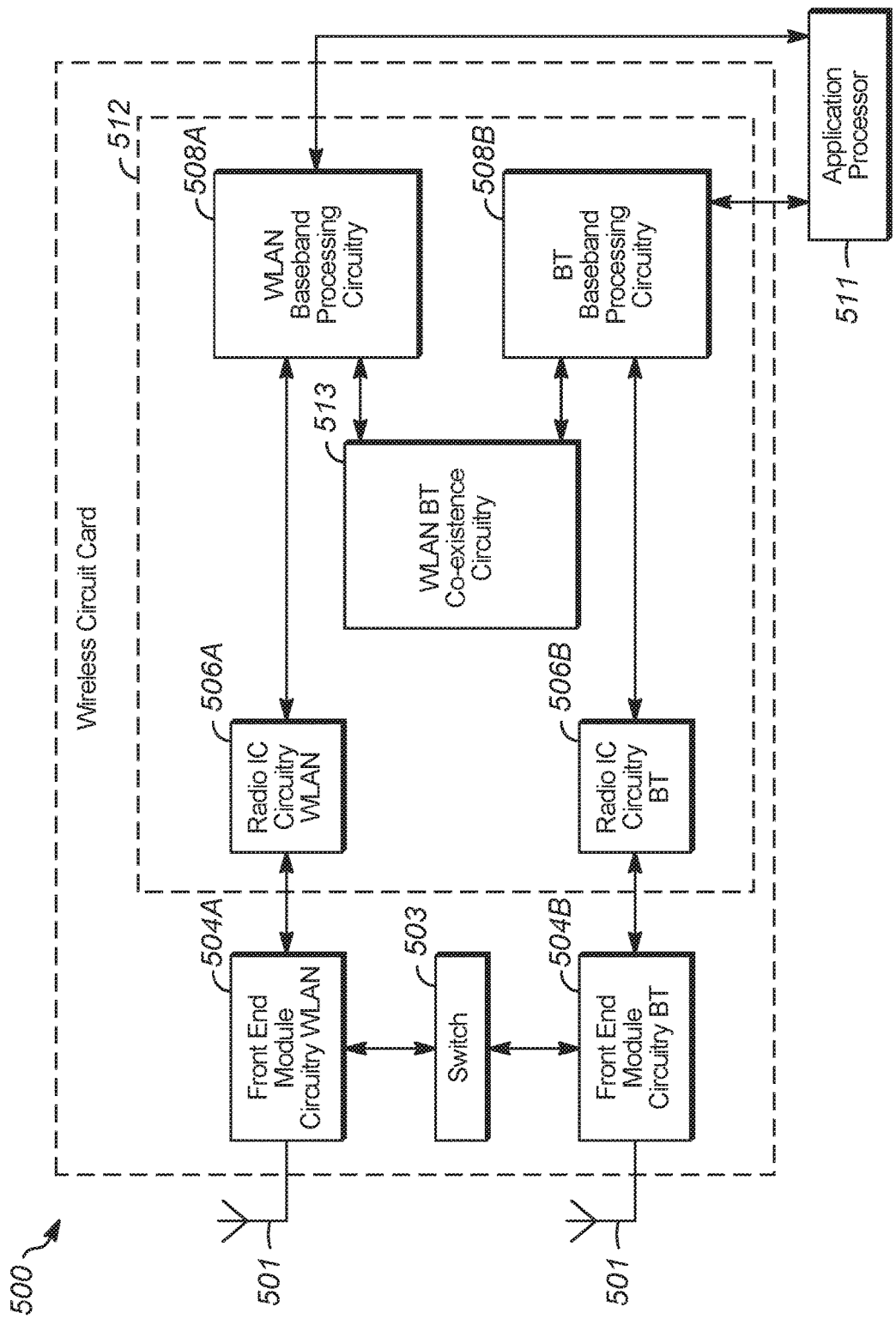
FIG. 5 is a block diagram of a radio architecture in accordance with some aspects of the disclosure.

FIG. 5 is a block diagram of a radio architecture 500 in accordance with some aspects of the disclosure. Radio architecture 500 may include radio front-end module (FEM) circuitry 504A and 504B, radio IC circuitry 506A and 506B, and baseband processing circuitry 508A and 508B. Radio architecture 500 as shown includes both Wireless Local Area Network (WLAN) functionality and Bluetooth® (BT) functionality although aspects of the disclosure are not so limited. In this disclosure, "WLAN" and "Wi-Fi" are used interchangeably.

FEM circuitry may include WLAN or Wi-Fi FEM circuitry 504A and Bluetooth (BT) FEM circuitry 504B. The WLAN FEM circuitry 504A may include a receive signal path comprising circuitry configured to operate on WLAN RF signals received from one or more antennas 501, to amplify the received signals and to provide the amplified versions of the received signals to the WLAN radio IC circuitry 506A for further processing. The BT FEM circuitry 504B may include a receive signal path which may include circuitry configured to operate on BT RF signals received from one or more antennas 501, to amplify the received signals and to provide the amplified versions of the received signals to the BT radio IC circuitry 506B for further processing. FEM circuitry 504A may also include a transmit signal path which may include circuitry configured to amplify WLAN signals provided by the radio IC circuitry 506A for wireless transmission by one or more of the antennas 501. In addition, FEM circuitry 504B may also include a transmit signal path which may include circuitry configured to amplify BT signals provided by the radio IC circuitry 506B for wireless transmission by the one or more antennas. As described below, aspects of the disclosure of each of the transmit signal paths may include a DPD system to compensate for nonlinearities in the power amplifier frequency response characteristic. In the embodiment of FIG. 5, although FEM 504A and FEM 504B are shown as being distinct from one another, aspects of the disclosure are not so limited, and include within their scope the use of an FEM (not shown) that includes a transmit path and/or a receive path for both WLAN and BT signals, or the use of one or more FEM circuitries where at least some of the FEM circuitries share transmit and/or receive signal paths for both WLAN and BT signals. Furthermore, when WLAN systems use multiple frequency bands, there may be multiple instances of each of the WLAN FEMs, Radio ICs and/or baseband processing circuitry.

Radio IC circuitry may include WLAN radio IC circuitry 506A and BT radio IC circuitry 506B. The WLAN radio IC circuitry 506A may include a receive signal path which may include circuitry to down-convert WLAN RF signals received from the FEM circuitry 504A and provide baseband signals to WLAN baseband processing circuitry 508A. BT radio IC circuitry 506B may, in turn, include a receive signal path which may include circuitry to down-convert BT RF signals received from the FEM circuitry 504B and provide baseband signals to BT baseband processing circuitry 508B. WLAN radio IC circuitry 506A may also include a transmit signal path which may include circuitry to up-convert WLAN baseband signals provided by the WLAN baseband processing circuitry 508A and provide WLAN RF output signals to the FEM circuitry 504A for subsequent wireless transmission by the one or more antennas 501. BT radio IC circuitry 506B may also include a transmit signal path which may include circuitry to up-convert BT baseband signals provided by the BT baseband processing circuitry 508B and provide BT RF output signals to the FEM circuitry 504B for subsequent wireless transmission by the one or more antennas 501. In the embodiment of FIG. 5, although radio IC circuitries 506A and 506B are shown as being distinct from one another, aspects of the disclosure are not so limited, and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuity 508 may include a WLAN baseband processing circuitry 508A and a BT baseband processing circuitry 508B. The WLAN baseband processing circuitry 508A may include a memory, such as, for example, a set of RAM arrays in a Fast Fourier Transform or Inverse Fast Fourier Transform block (not shown) of the WLAN baseband processing circuitry 508A. Each of the WLAN baseband circuitry 508A and the BT baseband circuitry 508B may further include one or more processors and control logic to process the signals received from the corresponding WLAN or BT receive signal path of the radio IC circuitry 506, and to also generate corresponding WLAN or BT baseband signals for the transmit signal path of the radio IC circuitry 506. Each of the baseband processing circuitries 508A and 508B may further include physical layer (PHY) and medium access control layer (MAC) circuitry, and may further interface with application processor 511 for generation and processing of the baseband signals and for controlling operations of the radio IC circuitry 506.

Referring still to FIG. 5, according to the shown embodiment, WLAN-BT coexistence circuitry 513 may include logic providing an interface between the WLAN baseband circuitry 508A and the BT baseband circuitry 508B to enable use cases requiring WLAN and BT coexistence. In addition, a switch 503 may be provided between the WLAN FEM circuitry 504A and the BT FEM circuitry 504B to allow switching between the WLAN and BT radios according to application usage. In addition, although the antennas 501 are depicted as being respectively connected to the WLAN FEM circuitry 504A and the BT FEM circuitry 504B, aspects of the disclosure include within their scope the sharing of one or more antennas as between the WLAN and BT FEMs, or the provision of more than one antenna connected to each of FEM 504A or 504B.

According to some aspects of the disclosure, the front-end module circuitry 504A and 504B, the radio IC circuitry 506A and 506B, and baseband processing circuitry 508A and 508B may be provided on a single radio card, such as wireless radio card 502. In some other aspects of the disclosure, the one or more antennas 501, the FEM circuitry 504A and 504B, and the radio IC circuitry 506A and 506B may be provided on a single radio card. In some other aspects of the disclosure, the radio IC circuitry 506A and 506B, and the baseband processing circuitry 508A and 508B may be provided on a single chip or integrated circuit (IC), such as IC 512.

According to some aspects of the disclosure, the wireless radio card 502 may include a WLAN radio card and may be configured for Wi-Fi communication, although the scope of the aspects of the disclosure is not limited in this respect. In some of these aspects of the disclosure, the radio architecture 500 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers.

In some of these multicarrier aspects of the disclosure, radio architecture 500 may be part of a Wi-Fi communication station (STA) such as a wireless access point (AP), a base station or a mobile device including a Wi-Fi device. In some of these aspects of the disclosure, radio architecture 500 may be configured to transmit and receive signals in accordance with specific communication standards and/or protocols, such as any of the Institute of Electrical and Electronics Engineers (IEEE) standards including, IEEE 802.11n-2009, IEEE 802.11-2012, IEEE 802.11-2016, IEEE 802.11 ac, and/or IEEE 802.11ax standards and/or proposed specifications for WLANs, although the scope of aspects of the disclosure is not limited in this respect. Radio architecture 500 may also be suitable to transmit and/or receive communications in accordance with other techniques and standards.

According to some aspects of the disclosure, the radio architecture 500 may be configured for high-efficiency (HE) Wi-Fi communication in accordance with the IEEE 802.1 lax standard. In these aspects of the disclosure, the radio architecture 500 may be configured to communicate in accordance with an OFDMA technique, although the scope of the aspects of the disclosure is not limited in this respect.

According to some other aspects of the disclosure, the radio architecture 500 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the aspects of the disclosure is not limited in this respect.

According to some aspects of the disclosure, as further shown in FIG. 5, the BT baseband circuitry 508B may be compliant with a Bluetooth (BT) connectivity standard such as Bluetooth, Bluetooth 4.0 or Bluetooth 5.0, or any other iteration of the Bluetooth Standard. In aspects of the disclosure that include BT functionality as shown for example in FIG. 5, the radio architecture 500 may be configured to establish a BT synchronous connection oriented (SCO) link and/or a BT low energy (BT LE) link. In some of the aspects of the disclosure that include functionality, the radio architecture 500 may be configured to establish an extended SCO (eSCO) link for BT communication, although the scope of the aspects of the disclosure is not limited in this respect. In some of these aspects of the disclosure that include a BT functionality, the radio architecture may be configured to engage in a BT Asynchronous Connection-Less (ACL) communication, although the scope of the aspects of the disclosure is not limited in this respect. According to some aspects of the disclosure, as shown in FIG. 5, the functions of a BT radio card and WLAN radio card may be combined on a single wireless radio card, such as single wireless radio card 502, although aspects of the disclosure are not so limited, and include within their scope discrete WLAN and BT radio cards According to some aspects of the disclosure, the radio-architecture 500 may include other radio cards, such as a cellular radio card configured for cellular (e.g., 3GPP such as LTE, LTE-Advanced or 5G communication).

In some IEEE 802.11 systems, the radio architecture 500 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). According to some aspects of the disclosure, a 320 MHz channel bandwidth may be used. The scope of the aspects of the disclosure is not limited with respect to the above center frequencies however. These systems may have multiple instances of the radio IC circuitry 506A and FEM circuitry 504A.

Figure 6:
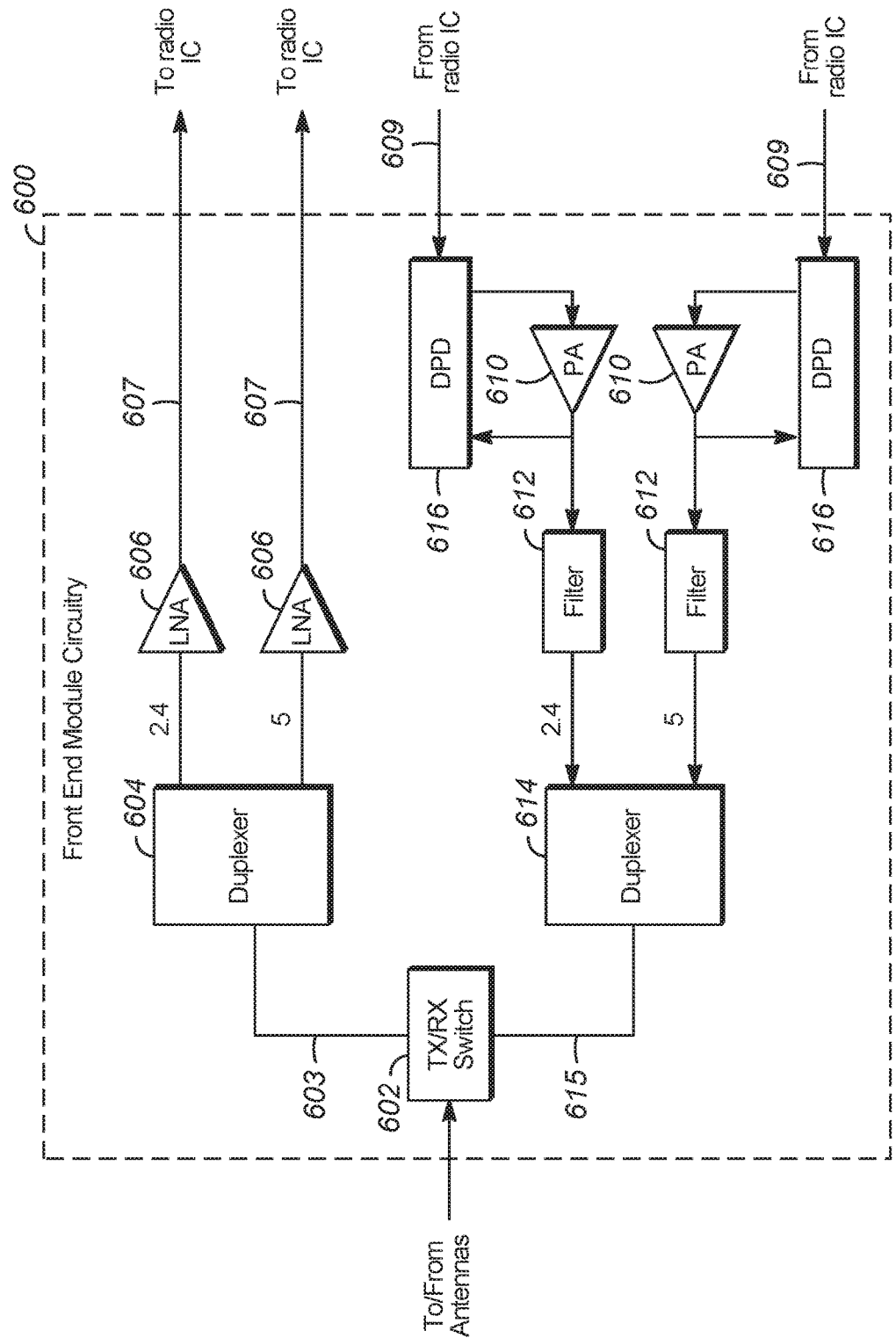
FIG. 6 illustrates a front-end module circuitry for use in the radio architecture of FIG. 5 in accordance with some aspects of the disclosure.

FIG. 6 illustrates FEM circuitry 600 suitable for use with the radio architecture of FIG. 5 in accordance with some aspects of the disclosure. The FEM circuitry 600 is one example of circuitry that may be suitable for use as the WLAN and/or BT FEM circuitry 504A/104B (FIG. 5), although other circuitry configurations may also be suitable.

According to some aspects of the disclosure, the FEM circuitry 600 may include a TX/RX switch 602 to switch between transmit mode and receive mode operation. Alternatively, if the system is configured for full-duplex operation, the TX/RX switch 602 may be eliminated and the FEM circuitry may include self-interference cancellation circuitry. The FEM circuitry 600 may include a receive signal path and a transmit signal path. The receive signal path of the FEM circuitry 600 may include a low-noise amplifier (LNA) 606 to amplify received RF signals 603 and provide the amplified received RF signals 607 as an output (e.g., to the radio IC circuitry 506 (FIG. 5)). The transmit signal path of the circuitry 600 may include a power amplifier (PA) to amplify input RF signals 609 (e.g., provided by the radio IC circuitry 506), and one or more filters 612, such as band-pass filters (BPFs), low-pass filters (LPFs) or other types of filters, to generate RF signals 615 for subsequent transmission (e.g., by one or more of the antennas 501 (FIG. 5)). As described above, each power amplifier 610 may be coupled to a DPD circuit 616.

In some dual-mode aspects of the disclosure for Wi-Fi communication, the FEM circuitry 600 may be configured to operate in either the 2.4 GHz frequency spectrum or the 5 GHz frequency spectrum or in other frequency spectrums. In these aspects of the disclosure, the receive signal path of the FEM circuitry 600 may include a receive signal path duplexer 604 to separate the signals from each spectrum as well as provide a separate LNA 606 for each spectrum as shown. In these aspects of the disclosure, the transmit signal path of the FEM circuitry 600 may also include a power amplifier 610 and a filter 612. Each power amplifier may also be coupled to a digital predistortion (DPD) circuit 616, as described above with reference to FIGS. 1-3. As shown, the data to be transmitted is modified by the DPD 616 before being applied to the power amplifier 610. The filter 612, coupled to the output of the power amplifier 610 may be a BPF, a LPF or another type of filter for each frequency spectrum and a transmit signal path duplexer 614 to provide the signals of one of the different spectrums onto a single transmit path for subsequent transmission by the one or more of the antennas 501 (FIG. 5). According to some aspects of the disclosure, BT communication may utilize the 2.4 GHZ signal paths and may utilize the same FEM circuitry 600 as the one used for WLAN communication.

Figure 7:
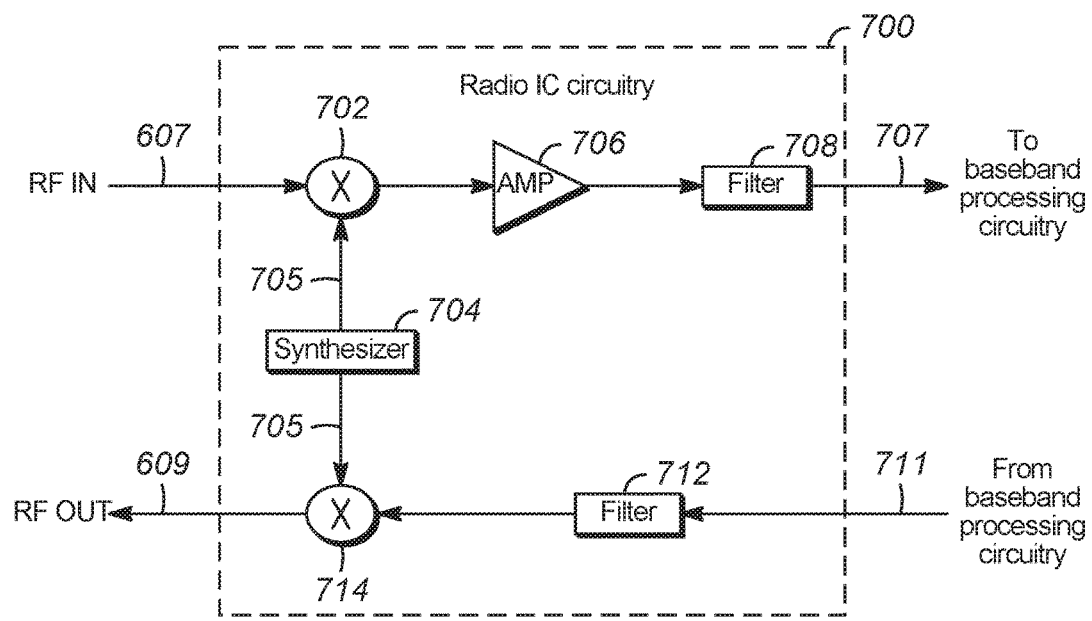
FIG. 7 illustrates a radio IC circuitry for use in the radio architecture of FIG. 5 in accordance with some aspects of the disclosure.

FIG. 7 illustrates radio IC circuitry 700 in accordance with some aspects of the disclosure. The radio IC circuitry 700 is one example of circuitry that may be suitable for use as the WLAN or BT radio IC circuitry 506A/506B (FIG. 5), although other circuitry configurations may also be suitable.

According to some aspects of the disclosure, the radio IC circuitry 700 may include a receive signal path and a transmit signal path. The receive signal path of the radio IC circuitry 700 may include at least mixer circuitry 702, such as, for example, down-conversion mixer circuitry, amplifier circuitry 706 and filter circuitry 708. The transmit signal path of the radio IC circuitry 700 may include at least filter circuitry 712 and mixer circuitry 714, such as, for example, up-conversion mixer circuitry. Radio IC circuitry 700 may also include synthesizer circuitry 704 for synthesizing a frequency 705 for use by the mixer circuitry 702 and the mixer circuitry 714. The mixer circuitry 702 and/or 714 may each, according to some aspects of the disclosure, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 7 illustrates only a simplified version of a radio IC circuitry, and may include, although not shown, aspects of the disclosure where each of the depicted circuitries may include more than one component. For instance, mixer circuitry 720 and/or 714 may each include one or more mixers, and filter circuitries 708 and/or 712 may each include one or more filters, such as one or more BPFs and/or LPFs according to application needs. For example, when mixer circuitries are of the direct-conversion type, they may each include two or more mixers.

According to some aspects of the disclosure, mixer circuitry 702 may be configured to down-convert RF signals 607 received from the FEM circuitry 504 (FIG. 5) based on the synthesized frequency 705 provided by synthesizer circuitry 704. The amplifier circuitry 706 may be configured to amplify the down-converted signals and the filter circuitry 708 may include a LPF configured to remove unwanted signals from the down-converted signals to generate output baseband signals 707. Output baseband signals 707 may be provided to the baseband processing circuitry 508A/508B (FIG. 5) for further processing. According to some aspects of the disclosure, the output baseband signals 707 may be zero-frequency baseband signals, although this is not a requirement. According to some aspects of the disclosure, mixer circuitry 702 may comprise passive mixers, although the scope of the aspects of the disclosure is not limited in this respect.

According to some aspects of the disclosure, the mixer circuitry 714 may be configured to up-convert input baseband signals 711 based on the synthesized frequency 705 provided by the synthesizer circuitry 704 to generate RF output signals 609 for the FEM circuitry 504. The baseband signals 711 may be provided by the baseband processing circuitry 508 and may be filtered by filter circuitry 712. The filter circuitry 712 may include a LPF or a BPF, although the scope of the aspects of the disclosure is not limited in this respect.

According to some aspects of the disclosure, the mixer circuitry 702 and the mixer circuitry 714 may each include two or more mixers and may be arranged for quadrature down-conversion and/or up-conversion respectively with the help of synthesizer 704. According to some aspects of the disclosure, the mixer circuitry 702 and the mixer circuitry 714 may each include two or more mixers each configured for image rejection (e.g., Hartley image rejection). According to some aspects of the disclosure, the mixer circuitry 702 and the mixer circuitry 714 may be arranged for direct down-conversion and/or direct up-conversion, respectively. According to some aspects of the disclosure, the mixer circuitry 702 and the mixer circuitry 714 may be configured for super-heterodyne operation, although this is not a requirement.

Mixer circuitry 702 may comprise, according to one embodiment: quadrature passive mixers (e.g., for the in-phase (I) and quadrature phase (Q) paths). In such an embodiment, RF input signal 607 from FIG. 7 may be down-converted to provide I and Q baseband output signals to be sent to the baseband processor Quadrature passive mixers may be driven by zero and ninety-degree time-varying LO switching signals provided by quadrature circuitry which may be configured to receive a LO frequency ($f_{Lo}$) from a local oscillator or a synthesizer, such as LO frequency 705 of synthesizer 704 (FIG. 7). According to some aspects of the disclosure, the LO frequency may be the carrier frequency, while in other aspects of the disclosure, the LO frequency may be a fraction of the carrier frequency (e.g., one-half the carrier frequency, one-third the carrier frequency). According to some aspects of the disclosure, the zero and ninety-degree time-varying switching signals may be generated by the synthesizer, although the scope of the aspects of the disclosure is not limited in this respect.

According to some aspects of the disclosure, the LO signals may differ in duty cycle (the percentage of one period in which the LO signal is high) and/or offset (the difference between start points of the period). According to some aspects of the disclosure, the LO signals may have a 25% duty cycle and a 50%/offset. According to some aspects of the disclosure, each branch of the mixer circuitry (e.g., the in-phase (I) and quadrature phase (Q) path) may operate at a 25% duty cycle, which may result in a significant reduction is power consumption.

The RF input signal 607 (FIG. 6) may comprise a balanced signal, although the scope of the aspects of the disclosure is not limited in this respect. The I and Q baseband output signals may be provided to low-nose amplifier, such as amplifier circuitry 706 (FIG. 7) or to filter circuitry 708 (FIG. 7).

According to some aspects of the disclosure, the output baseband signals 707 and the input baseband signals 711 may be analog baseband signals, although the scope of the aspects of the disclosure is not limited in this respect. In some alternate aspects of the disclosure, the output baseband signals 707 and the input baseband signals 711 may be digital baseband signals. In these alternate aspects of the disclosure, the radio IC circuitry may include analog-to-digital converter (ADC) and digital-to-analog converter (DAC) circuitry.

In some dual-mode aspects of the disclosure, a separate radio IC circuitry may be provided for processing signals for each spectrum, or for other spectrums not mentioned here, although the scope of the aspects of the disclosure is not limited in this respect.

According to some aspects of the disclosure, the synthesizer circuitry 704 may be a fractional-N synthesizer or a fractional N/N+1 synthesizer, although the scope of the aspects of the disclosure is not limited in this respect as other types of frequency synthesizers may be suitable. For example, synthesizer circuitry 704 may be a delta-sigma synthesizer, a frequency multiplier, or a synthesizer comprising a phase-locked loop with a frequency divider. According to some aspects of the disclosure, the synthesizer circuitry 704 may include digital synthesizer circuitry. An advantage of using a digital synthesizer circuitry is that, although it may still include some analog components, its footprint may be scaled down much more than the footprint of an analog synthesizer circuitry. According to some aspects of the disclosure, frequency input into synthesizer circuity 704 may be provided by a voltage controlled oscillator (VCO), although that is not a requirement. A divider control input may further be provided by either the baseband processing circuitry 508 (FIG. 5) or the application processor 511 (FIG. 5) depending on the desired output frequency 705. According to some aspects of the disclosure, a divider control input (e.g., N) may be determined from a look-up table (e.g., within a Wi-Fi card) based on a channel number and a channel center frequency as determined or indicated by the application processor 511.

According to some aspects of the disclosure, synthesizer circuitry 704 may be configured to generate a carrier frequency as the output frequency 705, while in other aspects of the disclosure, the output frequency 705 may be a fraction of the carrier frequency (e.g., one-half the carrier frequency, one-third the carrier frequency). According to some aspects of the disclosure, the output frequency 705 may be a LO frequency ($f_{LO}$).

Figure 8:
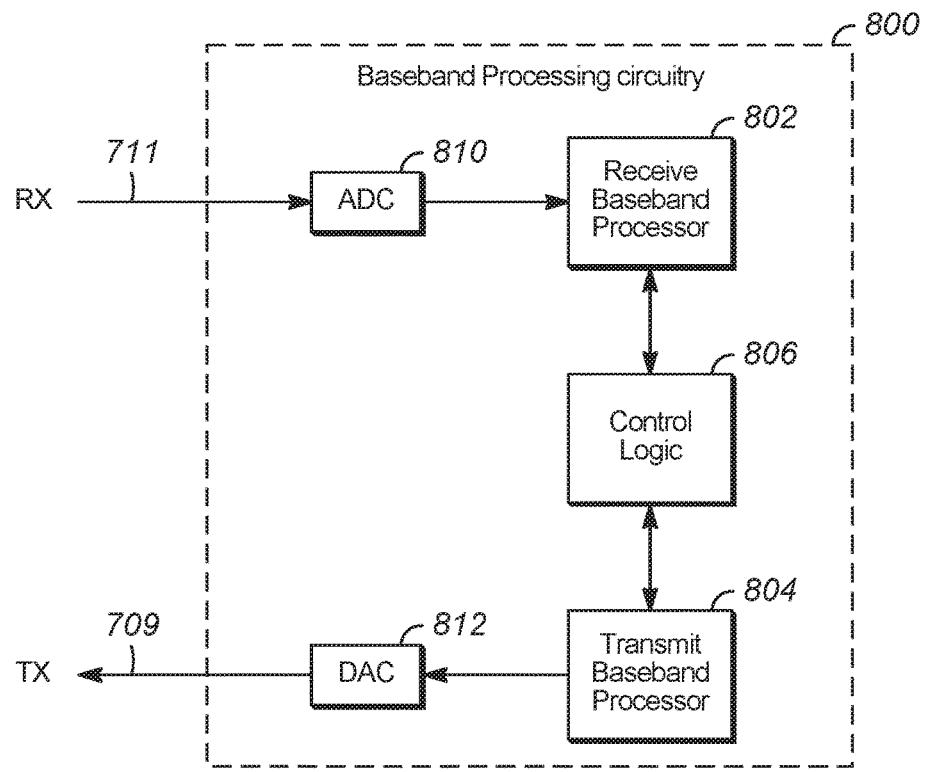
FIG. 8 illustrates a baseband processing circuitry for use in the radio architecture of FIG. 1 in accordance with some aspects of the disclosure.

FIG. 8 illustrates a functional block diagram of baseband processing circuitry 800 in accordance with some aspects of the disclosure. The baseband processing circuitry 800 is one example of circuitry that may be suitable for use as the baseband processing circuitry 508A/508B (FIG. 5), although other circuitry configurations may also be suitable. The baseband processing circuitry 800 may include a receive baseband processor (RX BBP) 802 for processing receive baseband signals 709 provided by the radio IC circuitry 506 (FIG. 5) and a transmit baseband processor (TX BBP) 804 for generating transmit baseband signals 711 for the radio IC circuitry 506. The baseband processing circuitry 800 may also include control logic 806 for coordinating the operations of the baseband processing circuitry 800.

According to some aspects of the disclosure (e.g., when analog baseband signals are exchanged between the baseband processing circuitry 800 and the radio IC circuitry 506), the baseband processing circuitry 800 may include ADC 810 to convert analog baseband signals received from the radio IC circuitry 506 to digital baseband signals for processing by the RX BBP 802. In these aspects of the disclosure, the baseband processing circuitry 800 may also include DAC 812 to convert digital baseband signals from the TX BBP 804 to analog baseband signals.

According to some aspects of the disclosure, devices that communicate using OFDM signals or OFDMA signals, such as through baseband processor 508A, the transmit baseband processor 804 may be configured to generate OFDM or OFDMA signals as appropriate for transmission by performing an inverse fast Fourier transform (IFFT). The receive baseband processor 802 may be configured to process received OFDM signals or OFDMA signals by performing an FFT. In some aspects of the disclosure, the receive baseband processor 802 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 5, in some aspects of the disclosure, the antennas 501 (FIG. 5) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) aspects of the disclosure, the antennas may be effectively separated to take advantage of spatial diversity and the different channel characteristics that may result. Antennas 501 may each include a set of phased-array antennas, although aspects of the disclosure are not so limited.

Although the radio-architecture 500 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. According to some aspects of the disclosure, the functional elements may refer to one or more processes operating on one or more processing elements.

EXAMPLES

Example 1 may include an apparatus for implementing an adaptive controller for a nonlinear system, the controller including: a non-linear signal processing circuit; a circuit based on a Volterra series, coupled to receive input sample values and provide output signals as an input terminal of the non-linear signal processing circuit, the circuit based on the Volterra series having a transfer function defined by P coefficients, where P is an integer greater than 1 and less than 500; an alignment and compensation circuit, coupled to the input terminal and to an output terminal of the nonlinear signal processing circuit, the alignment and compensation circuit being arranged to align the input samples and output samples of the nonlinear signal processing circuit; and a processor, configured to: generate a P×P matrix using samples from the nonlinear signal processing circuit; normalize elements in the P×P matrix using respective normalization factors; solve a system of P linear equations based on the P×P matrix to obtain P values; multiply ones of the P values by inverses of respective ones of the normalization factors to generate the P coefficients; and apply the P coefficients to the circuitry based on the Volterra series to compensate signals processed by the nonlinear signal processing circuit.

Example 2 may include the apparatus of example 1 or any other example herein, wherein the processor is configured to: receive output sample values of an analog output signal of the nonlinear signal processing circuit; apply a Volterra series to the output sample values of the nonlinear signal processing circuit to generate multiple values; generate the P×P matrix from the multiple values; and calculate the normalization factors based on P diagonal elements of the P×P matrix.

Example 3 may include the apparatus of example 2 or any other example herein, wherein the multiple values include M rows of values, where M is an integer greater than P and less than 20000, and the processor is configured to normalize each element of the P×P matrix by: calculating $$\sigma_i = \sqrt{\frac{M}{a_{ii}}}$$

for each of the P diagonal elements, $a_{ii}$, of the P×P matrix; and multiplying each element, $a_{ij}$ of the P×P matrix by $\sigma_i \cdot \sigma_j$, where i, j∈{1, 2, ..., P}.

Example 4 may include the apparatus of example 1 or any other example herein, wherein the nonlinear signal processing circuit is a power amplifier of communication equipment, the circuitry based on the Volterra series includes a digital postdistortion filter, and the processor is configured to: generate the P×P matrix by applying output samples of the power amplifier to the Volterra series; decompose the P×P matrix into a lower triangular matrix, a diagonal matrix, and an upper triangular matrix corresponding to a complex conjugate of the lower triangular matrix to generate the system of P linear equations; and apply forward-backward elimination to the P×P matrix and to a P×1 vector derived from input samples to the power amplifier solve the system of P linear equations.

Example 5 may include the apparatus of example 4 or any other example herein, wherein the processor is configured to apply Cholesky decomposition to decompose the P×P matrix.

Example 6 may include the apparatus of example 5 or any other example herein, wherein the processor is configured to apply a Fast Inverse Square Root operation to the elements of the diagonal matrix as a part of the Cholesky decomposition.

Example 7 may include the apparatus of example 1 or any other example herein, wherein the normalization factors are predetermined normalization factors and the processor is configured to multiply each element of the P×P matrix by a respective one of the predetermined normalization factors.

Example 8 may include the apparatus of example 1 or any other example herein, wherein the nonlinear system is a power amplifier of communication equipment and the circuitry based on the Volterra series includes a digital predistortion filter, and the processor is configured to: generate the P×P matrix by applying input samples of the power amplifier to the Volterra series; decompose the P×P matrix into a lower triangular matrix, a diagonal matrix, and an upper triangular matrix corresponding to a complex conjugate of the lower triangular matrix to generate a decomposed P×P matrix; and apply forward-backward elimination to the P×P matrix and to a P×1 vector derived from input and output samples of the power amplifier to solve the system of P linear equations.

Example 9 may include the apparatus of example 1 or any other example herein, wherein the processor is configured to apply Cholesky decomposition to decompose the P×P matrix.

Example 10 may include the apparatus of example 1 or any other example herein, wherein the processor includes a single-precision floating-point digital signal processor (DSP).

Example 11 may include a method for generating a digitally predistorted signal for a power amplifier of a communication device, the method comprising: applying input samples to be modified to a digital predistortion (DPD) filter corresponding to a Volterra series and having a predetermined number, P, of coefficients, to generate predistorted samples; converting the predistorted samples to an analog signal to be applied to an input terminal of the power amplifier; digitizing an output signal provided by the power amplifier to produce output samples; building a system of P linear equations, defined by a P×P matrix based on the input samples or the output samples; normalizing elements of the P×P matrix using respective normalization factors; solving the system of P linear equations based on the P×P matrix to generate P values; multiplying ones of the P values by inverses of respective ones of the normalization factors to generate the P coefficients for the DPD filter; and applying the P coefficients to the DPD filter.

Example 12 may include the method of example 11 or any other example herein, further comprising generating the normalization factors from diagonal elements of the P×P matrix.

Example 13 may include the method of example 12 or any other example herein, wherein building the P×P matrix includes: receiving the output samples of the power amplifier; applying the output samples to the Volterra series to generate multiple rows of values; generating the P×P matrix from the multiple rows of values; and building the system of P linear equations includes generating a P×1 vector from the input and output samples of the power amplifier.

Example 14 may include the method of example 13 or any other example herein, wherein solving the system of P linear equations further includes applying forward and backward elimination to the system of P linear equations.

Example 15 may include the method of example 11 or any other example herein, wherein building the P×P matrix includes: receiving the input samples to the DPD filter; applying the input samples to the Volterra series to generate multiple rows of values; generating the P×P matrix from the multiple rows of values; and building the system of P linear equations includes generating a P×1 vector derived from the input and output samples of the power amplifier.

Example 16 may include the method of example 15 or any other example herein, wherein solving the system of P linear equations includes decomposing the P×P matrix using Cholesky decomposition and applying forward and backward elimination to the system of linear equations including the decomposed P×P matrix and the P×1 vector.

Example 17 may include the method of example 11 or any other example herein, wherein the normalization factors are predetermined normalization factors and normalizing each element of the P×P matrix includes applying a respective one of the predetermined normalization factors to each element of the P×P matrix.

Example 18 may include a non-transitory computer readable medium including: first program instructions for a first processor, the program instructions being configured to cause a first processor to: apply input samples to be modified to a digital predistortion (DPD) filter corresponding to a Volterra series and having a predetermined number, P, of coefficients, to generate predistorted samples; convert the predistorted samples to an analog signal to be applied to an input terminal of the power amplifier; digitize an output signal provided by the power amplifier to provide output samples; build a system of P linear equations, defined by a P×P matrix based on the input samples or the output samples; normalize elements of the P×P matrix using respective normalization factors; solve the system of P linear equations based on the P×P matrix to generate P values; multiply ones of the P values by inverses of respective ones of the normalization factors to generate the P coefficients for the DPD filter; and apply the P coefficients to the DPD filter.

Example 19 may include the non-transitory computer readable medium of example 18 or any other example herein, wherein the first program instructions include program instructions for a microprocessor and the second program instructions include program instructions for a digital signal processor (DSP).

Example 20 may include the non-transitory computer readable medium of example 18 or any other example herein, wherein the program instructions are further configured to cause the second processor to calculate the normalization factors from diagonal elements of the P×P matrix.

Example 21 may include the non-transitory computer readable medium of example 18 or any other example herein, wherein the second program instructions include second program instructions that cause the second processor to build the P×P matrix to generate P coefficients for a digital postdistortion filter, wherein the P coefficients of the DPD filter are the P coefficients of the digital postdistortion filter, wherein the second program instructions include second program instructions that cause the second processor to: receive the output samples of the power amplifier; apply the output samples to the Volterra series to generate multiple rows of values; generate the P×P matrix from the multiple rows of values; and build the system of P linear equations including generating a P×1 vector from the input and output samples of the power amplifier.

Example 22 may include the non-transitory computer readable medium of example 21 or any other example herein, wherein, the second program instructions that cause the second processor to solve the system of P linear equations further include second instructions that cause the second processor to decompose the P×P matrix using Cholesky decomposition and to apply forward and backward elimination to the system of P linear equations including the decomposed P×P matrix and the P×1 vector.

Example 23 may include the non-transitory computer readable medium of example 18 or any other example herein, wherein the second program instructions that cause the second processor to build the P×P matrix and to solve the system of linear equations include second program instructions that cause the second processor to: receive the input samples to the DPD filter; apply the input samples to the Volterra series to generate multiple rows of values; generate the P×P matrix from the multiple rows of values; and build the system of P linear equations including generating a P×1 vector from the input and output samples of the power amplifier.

Example 24 may include the non-transitory computer readable medium of example 18 or any other example herein, wherein the normalization factors are predetermined normalization factors and wherein the second program instructions that cause the second processor to normalize each element of the P×P matrix include second program instructions that cause the second processor to apply a apply a respective one of the predetermined normalization factors to each element of the P×P matrix.

Example 25 may include the non-transitory computer readable medium of example 18 or any other example herein, wherein second program instructions that cause the second processor to solve the system of P linear equations include instructions for processing single-precision floating-point values.

Example 26 may include an apparatus for generating a digitally predistorted signal for a power amplifier of a communication device, the apparatus comprising: means for applying input samples to be modified to a digital predistortion (DPD) filter corresponding to a Volterra series and having a predetermined number, P, of coefficients, to generate predistorted samples; means for converting the predistorted samples to an analog signal to be applied to an input terminal of the power amplifier; means for digitizing an output signal provided by the power amplifier to produce output samples; means for building a system of P linear equations, defined by a P×P matrix based on the input samples or the output samples; means for normalizing elements of the P×P matrix using respective normalization factors; means for solving the system of P linear equations based on the P×P matrix to generate P values; means for multiplying ones of the P values by inverses of respective ones of the normalization factors to generate the P coefficients for the DPD filter; and means for applying the P coefficients to the DPD filter.

Example 27 may include the apparatus of example 26 or any other example herein, further comprising means for generating the normalization factors from diagonal elements of the P×P matrix.

Example 28 may include the apparatus of example 27 or any other example herein, wherein the means for building the P×P matrix includes: means for receiving the output samples of the power amplifier; means for applying the output samples to the Volterra series to generate multiple rows of values; means for generating the P×P matrix from the multiple rows of values; and means for building the system of P linear equations including means for generating a P×1 vector from the input and output samples of the power amplifier.

Example 29 may include the apparatus of example 28 or any other example herein, wherein the means for solving the system of P linear equations further includes means for decomposing the P×P matrix using Cholesky decomposition and means for applying forward and backward elimination to the system of P linear equations including the decomposed P×P matrix and the P×1 vector.

Example 30 may include the apparatus of example 26 or any other example herein, wherein the means for building the P×P matrix includes: means for receiving the input samples to the DPD filter; means for applying the input samples to the Volterra series to generate multiple rows of values; means for generating the P×P matrix from the multiple rows of values; and means for building the system of P linear equations including means for generating a P×1 vector derived from the input and output samples of the power amplifier.

Example 31 may include the apparatus of example 30 or any other example herein, wherein the means for solving the system of P linear equations includes means for decomposing the P×P matrix using Cholesky decomposition and means for applying forward and backward elimination to the system of linear equations including the decomposed P×P matrix and the P×1 vector.

Example 32 may include the apparatus of example 26 or any other example herein, wherein the normalization factors are predetermined normalization factors and the means for normalizing each element of the P×P matrix includes means for applying a respective one of the predetermined normalization factors to each element of the P×P matrix.

The invention claimed is:

1. An adaptive controller for a nonlinear system, the controller comprising:
a non-linear signal processing circuit;
a circuit based on a Volterra series, coupled to receive input sample values and provide output signals as an input terminal of the non-linear signal processing circuit, the circuit based on the Volterra series having a transfer function defined by a predetermined number, P, of coefficients;
an alignment and compensation circuit, coupled to the input terminal and to an output terminal of the nonlinear signal processing circuit, the alignment and compensation circuit being arranged to align the input samples and output samples of the nonlinear signal processing circuit; and
a processor, configured to:
generate a P×P matrix using samples from the nonlinear signal processing circuit;
normalize elements in the P×P matrix using respective normalization factors;
solve a system of P linear equations based on the P×P matrix to obtain P values;
multiply ones of the P values by inverses of respective ones of the normalization factors to generate the P coefficients; and
apply the P coefficients to the circuitry based on the Volterra series to compensate signals processed by the nonlinear signal processing circuit.

2. The adaptive controller of claim 1, wherein the processor is configured to:
receive output sample values of an analog output signal of the nonlinear signal processing circuit;
apply a Volterra series to the output sample values of the nonlinear signal processing circuit to generate multiple values;
generate the P×P matrix from the multiple values; and
calculate the normalization factors based on P diagonal elements of the P×P matrix.

3. The adaptive controller of claim 2, wherein the multiple values include M rows of values, where M is an integer greater than P and less than 20000, and the processor is configured to normalize each element of the P×P matrix by: calculating $$\sigma_i = \sqrt{\frac{M}{a_{ii}}}$$

using a Fast Inverse Square Root operation for each of the P diagonal elements, $a_{ii}$, of the P×P matrix; and
multiplying each element, $a_{ij}$, of the P×P matrix by $\sigma_i \cdot \sigma_j$, where i, j∈{1, 2, ..., P}.

4. The adaptive controller of claim 1, wherein the nonlinear signal processing circuit is a power amplifier of a communication equipment, the circuitry based on the Volterra series includes a digital postdistortion filter, and the processor is configured to:
generate the P×P matrix by applying output samples of the power amplifier to the Volterra series;
decompose the P×P matrix into a lower triangular matrix, a diagonal matrix, and an upper triangular matrix corresponding to a complex conjugate of the lower triangular matrix to generate the system of P linear equations; and
apply forward-backward elimination to the P×P matrix and to a P×1 vector derived from input samples to the power amplifier solve the system of P linear equations.

5. The adaptive controller of claim 4, wherein the processor is configured to apply Cholesky decomposition to decompose the P×P matrix.

6. The adaptive controller of claim 5, wherein the processor is configured to apply a Fast Inverse Square Root operation to the elements of the diagonal matrix as a part of the Cholesky decomposition.

7. The adaptive controller of claim 1, wherein the normalization factors are predetermined normalization factors and the processor is configured to multiply each element of the P×P matrix by a respective one of the predetermined normalization factors.

8. The adaptive controller of claim 1, wherein the nonlinear system is a power amplifier of communication equipment and the circuitry based on the Volterra series includes a digital predistortion filter, and the processor is configured to:
generate the P×P matrix by applying input samples of the power amplifier to the Volterra series;
decompose the P×P matrix into a lower triangular matrix, a diagonal matrix, and an upper triangular matrix corresponding to a complex conjugate of the lower triangular matrix to generate a decomposed P×P matrix; and
apply forward-backward elimination to the decomposed P×P matrix and to a P×1 vector derived from input and output samples of the power amplifier to solve the system of P linear equations.

9. The adaptive controller of claim 8, wherein the processor is configured to apply Cholesky decomposition to decompose the P×P matrix.

10. The adaptive controller of claim 1, wherein the processor includes a single-precision floating-point digital signal processor (DSP).

11. A method for generating a digitally predistorted signal for a power amplifier of a communication device, the method comprising:
applying input samples to be modified to a digital predistortion (DPD) filter corresponding to a Volterra series and having a predetermined number, P, of coefficients, to generate predistorted samples;
converting the predistorted samples to an analog signal to be applied to an input terminal of the power amplifier;
digitizing an output signal provided by the power amplifier to produce output samples;
building a system of P linear equations, defined by a P×P matrix based on the input samples or the output samples;
normalizing elements of the P×P matrix using respective normalization factors;
solving the system of P linear equations based on the P×P matrix to generate P values;
multiplying ones of the P values by inverses of respective ones of the normalization factors to generate the P coefficients for the DPD filter; and
applying the P coefficients to the DPD filter.

12. The method of claim 11, further comprising generating the normalization factors from diagonal elements of the P×P matrix.

13. The method of claim 11, further comprising:
building the P×P matrix including:
receiving the output samples of the power amplifier;
applying the output samples to the Volterra series to generate multiple rows of values; and
generating the P×P matrix from the multiple rows of values;
wherein building the system of P linear equations includes generating a P×1 vector from the input and output samples of the power amplifier.

14. The method of claim 13, wherein solving the system of P linear equations further includes decomposing the P×P matrix using Cholesky decomposition and applying forward and backward elimination to the system of P linear equations including the decomposed P×P matrix and the P×1 vector.

15. The method of claim 11, further comprising
building the P×P matrix including:
receiving the input samples to the DPD filter;
applying the input samples to the Volterra series to generate multiple rows of values; and
generating the P×P matrix from the multiple rows of values;
wherein building the system of P linear equations includes generating a P×1 vector derived from the input and output samples of the power amplifier.

16. The method of claim 15, wherein solving the system of P linear equations includes decomposing the P×P matrix using Cholesky decomposition and applying forward and backward elimination to the system of linear equations including the decomposed P×P matrix and the P×1 vector.

17. The method of claim 11, wherein the normalization factors are predetermined normalization factors and normalizing each element of the P×P matrix includes applying a respective one of the predetermined normalization factors to each element of the P×P matrix.

18. A non-transitory computer readable medium comprising:
first program instructions for a first processor, the program instructions being configured to cause a first processor to:
apply input samples to be modified to a digital predistortion (DPD) filter corresponding to a Volterra series and having a predetermined number P of coefficients, to generate predistorted samples;
convert the predistorted samples to an analog signal to be applied to an input terminal of the power amplifier;
digitize an output signal provided by the power amplifier to provide output samples;
build a system of P linear equations, defined by a P×P matrix based on the input samples or the output samples;
normalize elements of the P×P matrix using respective normalization factors;
solve the system of P linear equations based on the P×P matrix to generate P values;
multiply ones of the P values by inverses of respective ones of the normalization factors to generate the P coefficients for the DPD filter; and
apply the P coefficients to the DPD filter.

19. The non-transitory computer readable medium of claim 18, wherein the first program instructions include program instructions for a microprocessor and the second program instructions include program instructions for a digital signal processor (DSP).

20. The non-transitory computer readable medium of claim 18, wherein the program instructions are further configured to cause the second processor to calculate the normalization factors from diagonal elements of the P×P matrix.

21. The non-transitory computer readable medium of claim 18, wherein the second program instructions include second program instructions that cause the second processor to build the P×P matrix to generate P coefficients for a digital postdistortion filter, wherein the P coefficients of the DPD filter are the P coefficients of the digital postdistortion filter, wherein the second program instructions include second program instructions that cause the second processor to:
receive the output samples of the power amplifier;
apply the output samples to the Volterra series to generate multiple rows of values;
generate the P×P matrix from the multiple rows of values; and build the system of P linear equations including generating a P×1 vector from the input and output samples of the power amplifier.

22. The non-transitory computer readable medium of claim 21, wherein the second program instructions that cause the second processor to solve the system of P linear equations further include second instructions that cause the second processor to decompose the P×P matrix using Cholesky decomposition and to apply forward and backward elimination to the system of P linear equations including the decomposed P×P matrix and the P×1 vector.

23. The non-transitory computer readable medium of claim 18, wherein the second program instructions that cause the second processor to build the P×P matrix and to solve the system of linear equations include second program instructions that cause the second processor to:
  receive the input samples to the DPD filter;
  apply the input samples to the Volterra series to generate multiple rows of values;
  generate the P×P matrix from the multiple rows of values; and
  build the system of P linear equations including generating a P×1 vector derived from the input and output samples of the power amplifier.

24. The non-transitory computer readable medium of claim 18, wherein the normalization factors are predetermined normalization factors and wherein the second program instructions that cause the second processor to normalize each element of the P×P matrix include second program instructions that cause the second processor to apply a apply a respective one of the predetermined normalization factors to each element of the P×P matrix.

25. The non-transitory computer readable medium of claim 18, wherein the second program instructions that cause the second processor to solve the system of P linear equations include instructions for processing single-precision floating-point values.

* * * * *